United States Patent
Makishima

(10) Patent No.: US 7,697,103 B2
(45) Date of Patent: Apr. 13, 2010

(54) IMAGE DISPLAY DEVICE

(75) Inventor: Tatsuo Makishima, Katsushika (JP)

(73) Assignee: Hitachi Displays, Ltd., Chiba (JP)

( * ) Notice: Subject to any disclaimer, the term of this patent is extended or adjusted under 35 U.S.C. 154(b) by 162 days.

(21) Appl. No.: 12/149,037

(22) Filed: Apr. 25, 2008

(65) Prior Publication Data
US 2008/0266507 A1   Oct. 30, 2008

(30) Foreign Application Priority Data
Apr. 27, 2007 (JP) ............................. 2007-117878

(51) Int. Cl.
*G02F 1/1337* (2006.01)
(52) U.S. Cl. ..................................... 349/151; 349/161
(58) Field of Classification Search ......... 349/151–161, 349/58, 77, 98
See application file for complete search history.

(56) References Cited

U.S. PATENT DOCUMENTS

| 2004/0066363 A1* | 4/2004 | Yamano et al. ............... 345/98 |
| 2005/0264500 A1* | 12/2005 | Shirasaki et al. ............. 345/77 |
| 2008/0030642 A1* | 2/2008 | Harayama ..................... 349/58 |

* cited by examiner

*Primary Examiner*—Akm E Ullah
(74) *Attorney, Agent, or Firm*—Stites & Harbison PLLC; Juan Carlos A. Marquez, Esq.

(57) ABSTRACT

The present invention provides an image display device which includes the heat radiation structure with a high radiation effect without increasing the number of parts and requiring additional steps in the manufacture of the display device. A metal foil having a large area is formed on a COF film provided for mounting a driver chip on a display panel, and heat generated by the driver chip is led to the metal foil and is radiated.

4 Claims, 4 Drawing Sheets

IMAGE DISPLAY DEVICE

CROSS-REFERENCE TO RELATED APPLICATION

The present application claims priority from Japanese application JP2007-117878 filed on Apr. 27, 2007, the content of which is hereby incorporated by reference into this application.

BACKGROUND OF THE INVENTION

1. Field of the Invention

The present invention relates to an image display device, and more particularly to a planar image display device which can suppress a malfunction of a driver attributed to the elevation of temperature.

2. Description of the Related Art

As a planar image display device, a liquid crystal display device, a plasma display device or an organic EL display device has been well-known. In addition to these display devices, display devices which adopt various other display methods have been put into practice, have been studied or are on their way to practical use. With respect to driving of these image display devices, the explanation is made hereinafter by taking the liquid crystal display device as an example. In general, the liquid crystal display device is constituted of a liquid crystal display module formed by assembling a printed circuit board such as a display control circuit, a backlight, and a power source printed circuit board of the backlight to a liquid crystal panel (hereinafter, also referred to as a liquid crystal panel or a panel simply), and a casing which houses the liquid crystal display module therein. The liquid crystal panel is constituted of two insulation substrates basically made of glass and liquid crystal sealed therebetween, wherein the liquid crystal forms a display region constituted of a large number of pixel arrays. As a typical example of an active-matrix-type liquid crystal panel popularly used in the display device, there has been known a so-called TN-type liquid crystal panel which mounts thin film transistors (TFT) constituting pixel circuits and various lines on one substrate and mounts color filters and a common electrode on another substrate, or a so-called IPS-type liquid crystal panel which mounts pixel electrodes and counter electrodes on one substrate. Further, on a periphery of the substrate constituting such a liquid crystal panel, a source driver for supplying display signals to the pixels and a gate driver for scanning the pixel arrays are mounted.

Along with the realization of an image display device with high definition or with super-high definition in recent years, a drive frequency at which a display signal is supplied to a large number of pixels formed on a panel rises and hence, self-heating of a source driver becomes too large to be ignored. Some image display devices adopt the front-surface closed structure which mounts an acrylic plate on a front surface of the panel. In such image display devices, heat generated by the panel itself is increased. When the image display device is a liquid crystal display device, an environmental temperature of the panel rises due to the radiation of heat from a backlight of the liquid crystal display device or the like and hence, there exists a possibility that a temperature of the source driver exceeds a use-limit temperature. Under such circumstances, it is urgently necessary to take measures to cope with the radiation of heat from drivers of the panel including the source driver.

As documents which disclose the related art relating to such measures to cope with the heat radiation, Japanese patent No. 3656455 (patent document 1) and JP-A-2000-268735 (patent document 2) are named. Patent document 1 discloses the heat radiation structure of an IC chip mounted on a flexible printed circuit board (FPC) on which a wiring pattern is formed, wherein a heat radiation body formed of an aluminum plate or the like is adhered to a back surface of the IC chip (a surface of the IC chip on a side opposite to the FPC). Further, patent document 2 discloses the heat radiation structure of an IC chip in which an FPC which mounts a driver thereon by way of a heat-radiation-use conductive pattern is fixed to a substrate of a panel.

SUMMARY OF THE INVENTION

In the heat radiation structure disclosed in patent document 1, the heat radiation member such as the aluminum plate is adhered to the back surface of the IC chip and hence, it is necessary to add the new part and an assembling step for adhesion of the new part whereby the structure becomes complicated and pushes up a cost. Further, in the heat radiation structure disclosed in patent document 2, the IC chip mounted by a tape carrier package (TCP) method is closely fixed to a conductive pattern formed of a metal thin film mounted on a patterned substrate of the panel using an adhesive agent having high heat conductivity such as an AG paste. Accordingly, the heat radiation structure requires a step of forming the conductive pattern and a step of adhering the IC chip to the conductive pattern and hence, the heat radiation structure also becomes complicated and pushes up a cost.

Accordingly, it is an object of the present invention to provide an image display device including the heat radiation structure which can exhibit a high heat radiation effect without requiring the increase of parts and the addition of steps in the manufacture of the display device.

An image display device according to the present invention includes a display panel forming a plurality of scanning lines and a plurality of data lines thereon, a driver chip for driving the display panel, and a film for connecting the driver chip with the display panel.

The driver chip is arranged on the film, and the film includes lines for connecting the driver chip and the display panel to each other and a heat radiation metal foil.

The film has the single-layered structure which is constituted by forming only one metal layer constituting the lines on a base film, the heat radiation metal foil is formed on the same layer as the metal layer, and heat generated by the driver chip is radiated by transmitting the heat to the heat radiation metal foil.

Further, as another constitution of the present invention, the film has the two-layered single structure which is constituted by forming a metal layer which constitutes the lines on one surface of a base film and by forming a second heat radiation metal foil on another surface of the base film on a side opposite to a surface of the film on which the driver chip is mounted, and the heat radiation metal foil and the second heat radiation metal foil are connected with each other via through holes which go through the base film.

Further, the driver chip includes dummy bumps connected to the heat radiation metal foil in addition to bumps connected to the lines on a surface thereof.

A source driver for a high definition panel usually adopts the COF (Chip On Film) mounting structure in many cases. This is because, with the use of the COF mounting structure, it is possible to realize the heat shielding between the driver chip (IC chip) as a heat generating body and the panel substrate, fine wiring (approximately 50 μmL/S) and the minimization of parts cost. In general, to minimize the parts cost, a single-layered film which forms a copper foil on one surface of a film is used in the COF mounting structure. In the present invention, while using such a single-layered film as a heat radiating means, a pattern of a conductive body of the single-layered film is modified thus realizing the heat radiating structure which can be manufactured at a low cost and can efficiently radiate heat. Further, when the heat radiating effect is insufficient with the use of the single-layered film, a two-layered film may be used.

According to the present invention, by adopting the structure which uses only the COF film which has been used conventionally, it is possible to obtain a high heat radiation effect without pushing up a cost. The radiation of heat of the heat generating body is performed by the radiation, the convection and the conduction. The related art aims at a cooling effect acquired by both of heat conduction and heat radiation by connecting a heat radiation sheet to a low-temperature frame (frame constituting a module). However, the present invention realizes a high cooling effect due to the radiation of heat using the metal foil by leading the heat generated by the IC chip (driver) to the metal foil having a large area formed on the COF film.

BRIEF DESCRIPTION OF THE DRAWINGS

FIG. 2A to FIG. 2C are views for explaining the embodiment 1 of the image display device according to the present invention, wherein FIG. 2A is a plan view of a single-layered COF, FIG. 2B is a cross-sectional view taken along a line X-X' in FIG. 2A, and FIG. 2C is a cross-sectional view taken along a line Y-Y' in FIG. 2A;

FIG. 4A to FIG. 4C are views for explaining an embodiment 2 of the image display device according to the present invention, wherein FIG. 4A is a plan view of a two-layered COF 40, FIG. 4B is a cross-sectional view taken along a line X-X' in FIG. 4A, and FIG. 4C is a cross-sectional view taken along a line Y-Y' in FIG. 4A.

DESCRIPTION OF THE PREFERRED EMBODIMENT

Hereinafter, preferred embodiments of the present invention are explained in detail in conjunction with drawings showing the embodiments.

Embodiment 1

Figure 1:
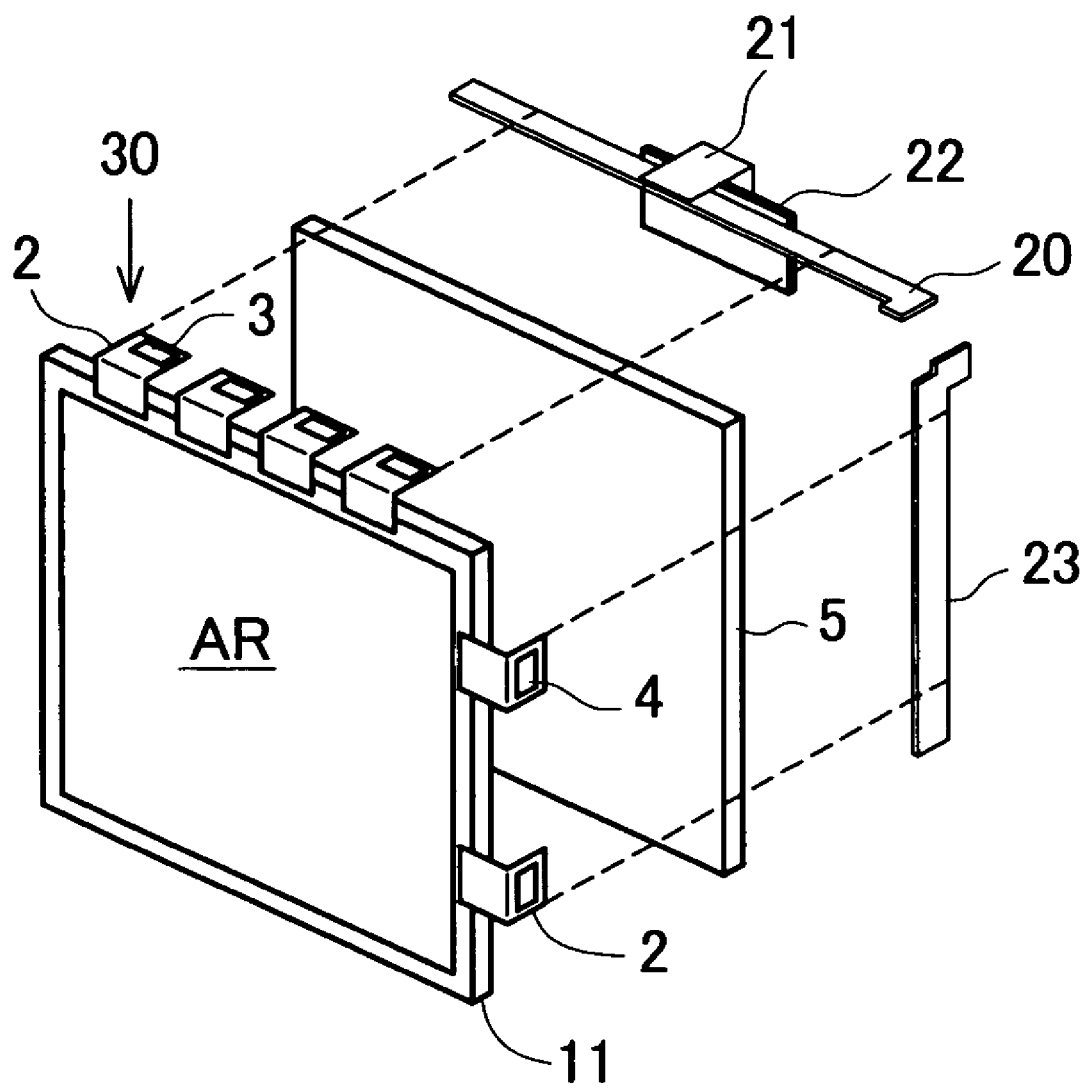
FIG. 1 is a developed perspective view for explaining an essential part of an embodiment 1 which applies an image display device according to the present invention to a liquid crystal display device.

FIG. 1 is a developed perspective view for explaining an essential part of the embodiment 1 which applies an image display device according to the present invention to a liquid crystal display device. In the liquid crystal display device, a liquid crystal display module is constituted of a liquid crystal panel 1, a backlight 5 and a display control printed circuit board 22. Here, most of a center portion of a substrate constituting the liquid crystal panel 1 is a display region AR, and a plurality of single-layered COFs 30 each of which is formed by mounting a source driver 3 on a printed film 2 is mounted on one side (an upper long side of the display panel shown in FIG. 1) out of a periphery of the display region AR. Further, a plurality of single-layered COFs 30 each of which is formed by mounting a gate driver 4 on a printed film 2 is mounted on other side (a right short side of the display panel shown in FIG. 1) out of the periphery of the display region AR.

The backlight 5 is arranged on a back side of the liquid crystal panel 1, and the display control printed circuit board 22 is arranged on a back surface of the backlight 5. The single-layered COF 30 which mounts the source driver 3 thereon and has one end thereof mounted on the upper long side of the liquid crystal panel 1 has another end thereof connected to a printed circuit board 20. The single-layered COF 30 which mounts the gate driver 4 thereon and has one end thereof mounted on the right short side of the liquid crystal panel 1 has another end thereof connected to a printed circuit board 23. The printed circuit board 20 and the printed circuit board 23 are connected to the display control printed circuit board 22 via an FPC 21.

Figure 2A:
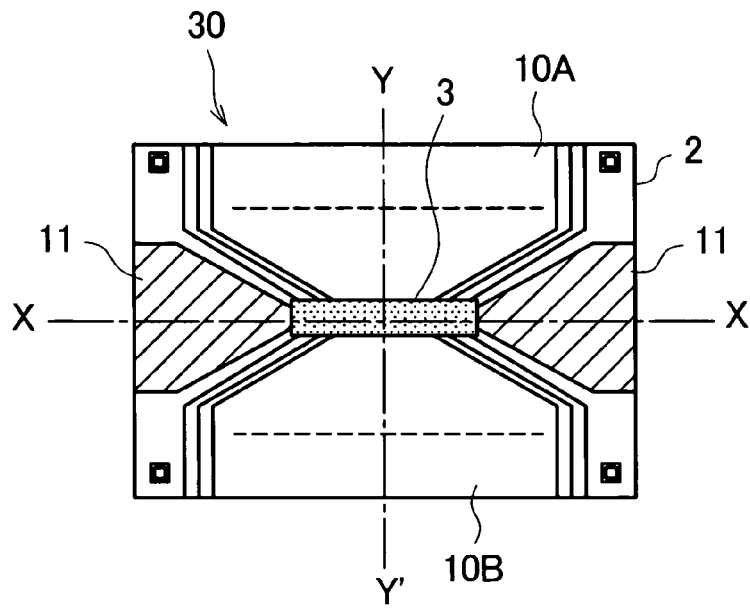
Figure 2C:
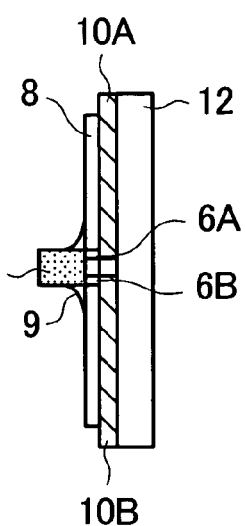
Figure 2B:
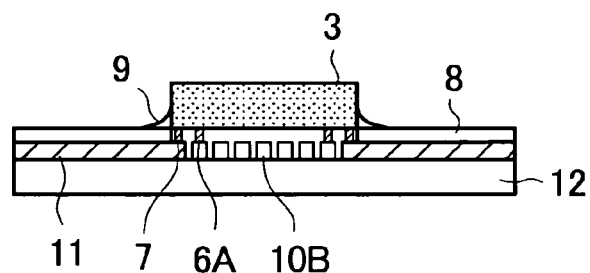

FIG. 2A to FIG. 2C are views for explaining the embodiment 1 of the image display device according to the present invention. In the embodiment 1, the single-layered COF 30 is used for mounting the driver on the liquid crystal panel. FIG. 2A is a plan view of the single-layered COF 30, FIG. 2B is a cross-sectional view taken along a line X-X' in FIG. 2A, and FIG. 2C is a cross-sectional view taken along a line Y-Y' in FIG. 2A. Here, in FIG. 1, although a length of the single-layered COF 30 in the direction along the line Y-Y' is described larger than a length of the single-layered COF 30 in the direction along the Y-Y' line shown in FIG. 2A to FIG. 2C, the length and sizes of other parts can be arbitrarily changed corresponding to the specification of the liquid crystal panel. Further, although FIG. 2A to FIG. 2C show the structure of the single-layered COF 30 for mounting the source driver on the liquid crystal panel of FIG. 1, the single-layered COF for mounting the gate driver on the liquid crystal panel has the substantially same basic structure as the single-layered COF 30 for mounting the source driver on the liquid crystal panel.

In FIG. 2A to FIG. 2C, the single-layered COF 30 which mounts the source driver 3 thereon forms input-side signal lines 10A and output-side signal lines 10B on one surface (an upper surface) of the base film 12 by patterning. The input-side signal lines 10A and the output-side signal lines 10B are formed of a copper foil in this embodiment. The input-side signal lines 10A are connected to the printed circuit board 20 in FIG. 1, and the output-side signal lines 10B are connected to source-line lead lines extending to the periphery of the display region AR from the display region AR of the panel 1. On a surface of the source driver 3, bumps (input-side bumps 6A and output-side bumps 6B) preferably made of gold are mounted corresponding to the input-side signal line 10A and the output-side signal line 10B respectively, and the these bumps are connected to the input-side signal lines 10A and the output-side signal lines 10B. The constitutions of connection portions between the bumps and the signal lines are omitted from the drawings.

Further, a heat radiation metal foil 11 also formed of a copper foil is arranged on both sides of the source driver 3 in the direction along the X-X' line of the base film 12 on the same layer as the input-side signal lines 10A and the output-side signal lines 10B. On a surface of the source driver 3, dummy bumps 7 are arranged in addition to the input-side bumps 6A and the output-side bumps 6B, and the dummy bumps 7 are connected to the heat radiation metal foil 11.

The input-side signal lines 10A and the output-side signal lines 10B have end portions thereof which are connected to the input-side bumps 6A and the output-side bumps 6B arranged on the surface of the source driver 3 (portions thereof corresponding to the surface of the driver) covered with an exposed solder resist 8. The source driver 3 is connected to the input-side signal lines 10A, the output-side signal lines 10B and the heat radiation metal foil 11 on the printed film 2 and, thereafter, a resin 9 is applied to a chip base portion of the source driver 3 for sealing.

Figure 3:
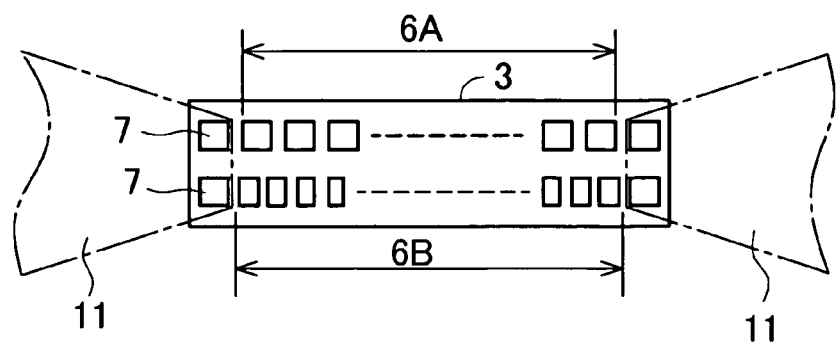
FIG. 3 is a schematic view for explaining an arrangement example of bumps formed on a surface of a source driver.

FIG. 3 is a schematic view for explaining an arrangement example of the bumps formed on the surface of the source driver. FIG. 3 corresponds to a view as viewed from a back side of a paper showing FIG. 2. The input-side bumps 6A and the output-side bumps 6B are formed along upper and lower long sides of the surface (a surface facing the printed film 2) of the source driver 3, and the dummy bumps 7 are formed along left and right short sides of the surface of the source driver 3. In the drawing, although two dummy bumps 7 are arranged on each short side, the number of dummy bump 7 is not limited to two, and, one, three or more dummy bumps 7 may be arranged on each short side. Further, the larger a contact area of the dummy bump 7 with the heat radiation metal foil 11 indicated by an imaginary line, it is possible to efficiently transmit the heat generated by the chip to the heat radiation metal foil 11.

According to the embodiment 1, the heat generated by the source driver 3 is efficiently transmitted to the heat radiation metal foil 11, and the heat is radiated from the heat radiation metal foil 11 and hence, it is possible to suppress the increase of a temperature of the source driver 3 per se. In this constitution, by using only the COF film which has been used conventionally, it is possible to obtain a high heat radiation effect without pushing up a cost.

Embodiment 2

Figure 4A:
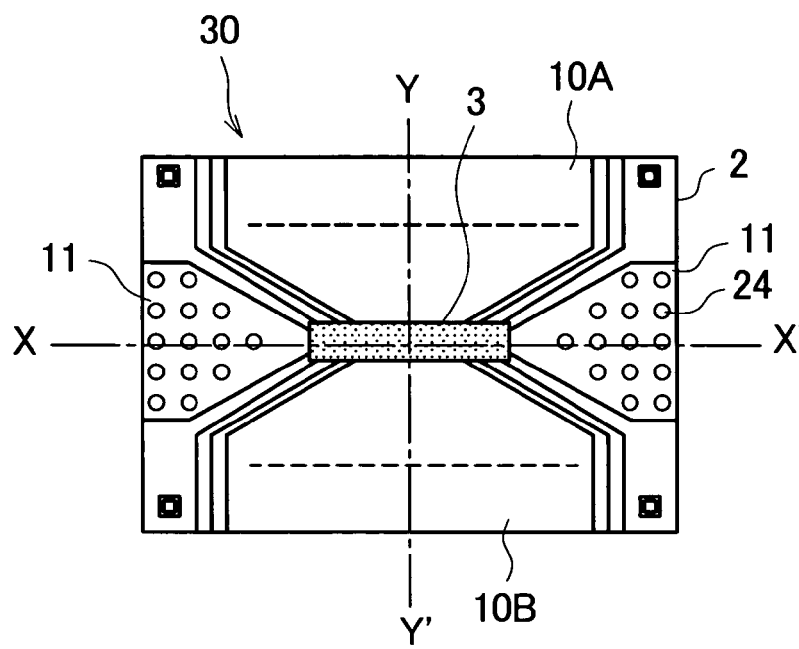
Figure 4C:
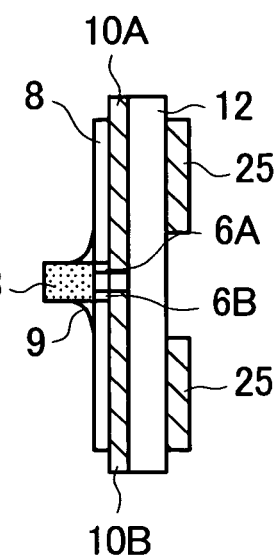
Figure 4B:
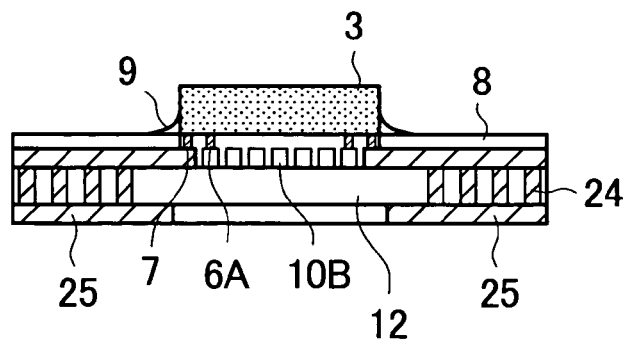

FIG. 4A to FIG. 4C are views for explaining an embodiment 2 of the image display device according to the present invention. In the embodiment 2, a two-layered COF 40 is used for mounting a driver on a liquid crystal panel. FIG. 4A is a plan view of the two-layered COF 40, FIG. 4B is a cross-sectional view taken along a line X-X' in FIG. 4A, and FIG. 4C is a cross-sectional view taken along a line Y-Y' in FIG. 4A. Here, also in FIG. 4A to FIG. 4C, although a size of the two-layered COF 40 in a line Y-Y' differs from a size of the single-layered COF 30 shown in FIG. 1 in the direction along the Y-Y' line, lengths and sizes of other parts can be arbitrarily changed corresponding to the specification of the liquid crystal panel in the same manner as the embodiment 1. Further, although FIG. 4A to FIG. 4C show the structure of the two-layered COF for mounting the source driver on the liquid crystal panel of FIG. 1, the two-layered COF having the substantially same constitution as the two-layered COF for mounting the source driver on the liquid crystal panel may be used for mounting a gate driver on the liquid crystal panel. However, the generation of heat of the gate driver is smaller than the generation of heat of the source driver and hence, a single-layered COF may be used for mounting the gate driver on the liquid crystal panel in the same manner as the embodiment 1.

In FIG. 4A to FIG. 4C, the two-layered COF 40 which mounts the source driver 3 thereon forms input-side signal lines 10A and output-side signal lines 10B on one surface (an upper surface) of a base film 12 by patterning. The input-side signal lines 10A and the output-side signal lines 10B are respectively formed of a copper foil in this embodiment. The input-side signal lines 10A are connected to the printed circuit board 20 in FIG. 1, and the output-side signal lines 10B are connected to source line lead lines which extend to a periphery of the display region AR from the display region AR of the panel 1. On a surface of the source driver 3, in the same manner as the above-mentioned constitution shown in FIG. 3, bumps (input-side bumps 6A and output-side bumps 6B) preferably made of gold are mounted corresponding to the input-side signal line 10A and the output-side signal line 10B respectively, and the these bumps are connected to the input-side signal lines 10A and the output-side signal lines 10B. The constitutions of connection portions between the bumps and the signal lines are omitted from the drawings.

Further, a heat radiation metal foil 11 also formed of a copper foil is arranged on both sides of the source driver 3 in the direction along the X-X' line of the base film 12 in the same layer as the input-side signal lines 10A and the output-side signal lines 10B. On a surface of the source driver 3, dummy bumps 7 are arranged in addition to the input-side bumps 6A and the output-side bumps 6B, and the dummy bumps 7 are connected to the heat radiation metal foil 11.

In the embodiment 2, the so-called two-layered COF is constituted by also arranging a second heat radiation metal foil 25 on a back surface of the base film 12 (a surface of the base film 12 on a side opposite to a chip-mounting surface) The second heat radiation metal foil 25 is connected to the heat radiation metal foil 11 via a plurality of through holes 24 which goes through the base film 12. A pattern of the second heat radiation metal foil 25 is not limited to a pattern shown in the drawing, and is arbitrarily adopted provided that the pattern does not interfere with the mounting of the source driver and a wiring pattern. Other constitutions are substantially equal to the corresponding constitutions shown in FIG. 2.

The embodiment 2 is effectively applicable when the heat radiation can not be performed sufficiently with the use of the single-layered COFs explained in conjunction with the embodiment 1. Heat generated by the source driver 3 is transmitted to the heat radiation metal foil 11, and is also transmitted to the second heat radiation metal foil 25 by way of the through holes 24. The transmitted heat is radiated from both of the heat radiation metal foil 11 and the second heat radiation metal foil 25 and hence, it is possible to suppress the elevation of temperature of the driver source 3 per se. Also in the embodiment 2, by using only the two-layered COF film which has been used conventionally, it is possible to obtain a high heat radiation effect without pushing up a cost.

In the embodiments 1, 2, the explanation has been made with respect to the constitution in which the drivers are mounted on the display panel by a COF method. However, a TCP (Tape Carrier Package) method may be adopted in place of the COF method. In the TCP method, a film thickness of a copper foil for wiring is larger than a film thickness of the copper foil for wiring used in the COF method by approximately 50% or more even at minimum. When a profile size of the display panel does not depend on a wiring pitch, for example, when a size of long sides of the chip is large so that a length of lines falls within the size of the long sides of the chip, it is possible to provide the same constitution as the embodiment 1 or the embodiment 2 using the TCP method.

Figure 5:
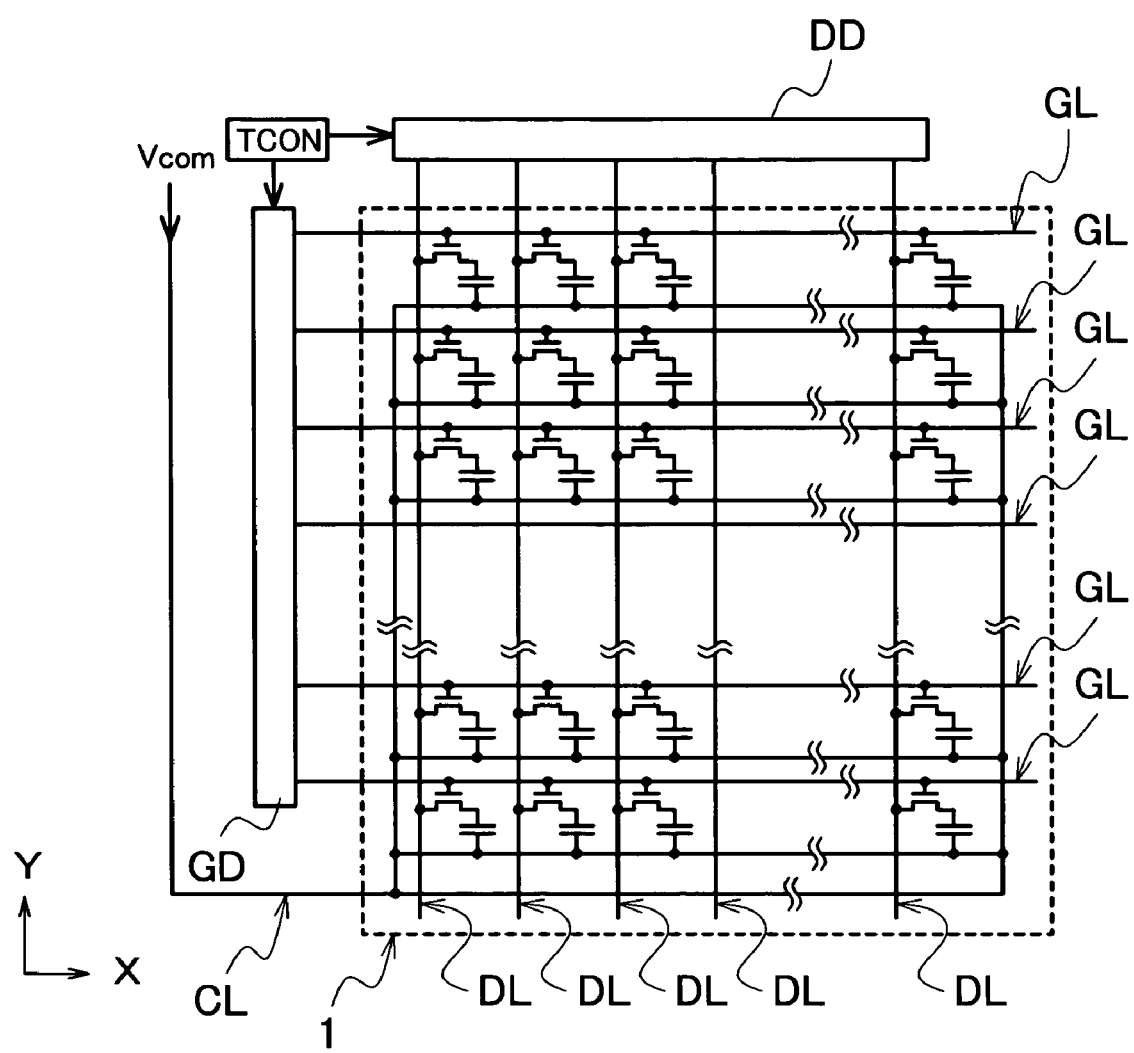
FIG. 5 is a circuit diagram of a lower substrate of a display device according to the present invention.

FIG. 5 is a circuit diagram of a circuit mounted on the back substrate which constitutes the display device according to the present invention.

A plurality of scanning lines GL (also referred to as gate lines) which extends in the first direction (X direction) and is arranged in parallel to each other in the second direction (Y direction) intersecting the first direction and a plurality of image data lines DL (also referred to as drain lines or source lines) which extends in the second direction (Y direction) and is arranged in parallel to each other in the first direction (X direction) intersecting the second direction are formed on a main surface of a printed circuit board. The gate lines GL are connected to a gate driver GD, and the drain lines DL are connected to a drain driver DD.

A timing control circuit TCON supplies timing signals to the gate driver GD and the drain driver DD.

Thin film transistors TFT are formed in regions surrounded by these lines which are arranged in a matrix array for respective pixels. The thin film transistor TFT has a gate electrode thereof connected to the gate line, a drain electrode thereof connected to the drain line and a source electrode thereof connected to the pixel electrode respectively. A region in which the pixel electrodes are formed constitutes an image display region.

Further, on the main surface of the printed circuit board, common lines CL are arranged in parallel to the gate lines. A capacitance is generated between the common line and the pixel electrode.

In the above-mentioned two embodiments, the drain driver or the gate driver is arranged on the printed film on which the heat radiation metal film is formed, and the printed film on which the driver is mounted is connected to the terminals of the printed circuit board. Due to such a constitution, it is possible to radiate the heat of the driver by way of the heat radiation metal foil.

The explanation has been made with respect to the image display device of the present invention by taking the active-matrix-type liquid crystal display device as an example heretofore. However, the present invention is not limited to such a liquid crystal display device, and is applicable in the same manner to a simple-matrix-type liquid crystal display device, an image display device such as a plasma display device or an organic EL display device, or an electronic apparatus which requires the substantially same heat radiation as the above-mentioned display devices.

What is claimed is:

1. An image display device comprising:
    a display panel forming a plurality of scanning lines and a plurality of data lines thereon;
    a driver chip for driving the display panel; and
    a film for connecting the driver chip with the display panel, wherein
    the driver chip is arranged on the film,
    the film includes lines for connecting the driver chip and the display panel to each other and a heat radiation metal foil, and
    the film has the single-layered structure which is constituted by forming only one metal layer constituting the lines on a base film, the heat radiation metal foil is formed on the same layer as the metal layer, and heat generated by the driver chip is radiated by transmitting the heat to the heat radiation metal foil.

2. An image display device according to claim 1, wherein dummy bumps connected to the heat radiation metal foil are formed on a surface of the driver chip in addition to bumps connected to the lines.

3. An image display device comprising:
    a display panel forming a plurality of scanning lines and a plurality of data lines thereon;
    a driver chip for driving the display panel; and
    a film for connecting the driver chip with the display panel, wherein
    the driver chip is arranged on the film,
    the film includes lines for connecting the driver chip and the display panel to each other, and a heat radiation metal foil, and
    the film has the two-layered single structure which is constituted by forming a metal layer which constitutes the lines on one surface of a base film and by forming a second heat radiation metal foil on another surface of the base film on a side opposite to a surface of the film on which the driver chip is mounted, and the heat radiation metal foil and the second heat radiation metal foil are connected with each other via through holes which go through the base film.

4. An image display device according to claim 3, wherein dummy bumps connected to the heat radiation metal foil are formed on a surface of the driver chip in addition to bumps connected to the lines.

* * * * *